United States Patent
Hiraide

(10) Patent No.: US 7,947,940 B2
(45) Date of Patent: May 24, 2011

(54) PHOTOELECTRIC CURRENT INTEGRATING CIRCUIT INCLUDING A CURRENT PASSING CIRCUIT

(75) Inventor: Shuzo Hiraide, Tokyo (JP)

(73) Assignee: Olympus Corporation, Tokyo (JP)

( * ) Notice: Subject to any disclaimer, the term of this patent is extended or adjusted under 35 U.S.C. 154(b) by 88 days.

(21) Appl. No.: 12/020,784

(22) Filed: Jan. 28, 2008

(65) Prior Publication Data

US 2008/0179500 A1    Jul. 31, 2008

(30) Foreign Application Priority Data

Jan. 31, 2007 (JP) ................................ 2007-020616
Nov. 20, 2007 (JP) ................................ 2007-300021

(51) Int. Cl.
*G01J 1/44* (2006.01)
*H03F 3/08* (2006.01)
*H01L 27/00* (2006.01)
(52) U.S. Cl. ............ 250/214 A; 250/214 R; 250/208.1
(58) Field of Classification Search ............. 250/214 R, 250/214 A, 214.1; 257/386; 327/514; 348/300, 348/301; 330/308
See application file for complete search history.

(56) References Cited

U.S. PATENT DOCUMENTS

| | | | | |
|---|---|---|---|---|
| 4,498,020 A | * | 2/1985 | Giolma et al. | 327/101 |
| 5,448,056 A | * | 9/1995 | Tsuruta | 250/214 A |
| 2003/0150979 A1 | * | 8/2003 | Lauffenburger et al. | 250/214 R |

FOREIGN PATENT DOCUMENTS

JP    2003315149 A      11/2003
JP    2006-128739    *  5/2006

* cited by examiner

*Primary Examiner* — Que T Le
*Assistant Examiner* — Pascal M Bui-Pho
(74) *Attorney, Agent, or Firm* — Westerman, Hattori, Daniels & Adrian, LLP

(57) ABSTRACT

A photoelectric current integrating circuit including: a first operational amplifier with a switch and an integrating capacitor connected in parallel between an input terminal and an output terminal thereof; a photodiode; and a current passing circuit provided between one terminal of the photodiode and the input terminal of the first operational amplifier, for passing a photoelectric current detected at the photodiode while blocking a connection between a parasitic capacitance of the photodiode and the integrating capacitor.

4 Claims, 4 Drawing Sheets

PHOTOELECTRIC CURRENT INTEGRATING CIRCUIT INCLUDING A CURRENT PASSING CIRCUIT

This application claims benefit of Japanese Patent Applications No. 2007-20616 filed in Japan on Jan. 31, 2007 and No. 2007-300021 filed in Japan on Nov. 20, 2007, the contents of which are incorporated by these references.

BACKGROUND OF THE INVENTION

The present invention relates to photoelectric current integrating circuits for integrating photoelectric currents detected at photodiode, and more particularly relates to photoelectric current integrating circuit where the photoelectric currents detected at photodiode are integrated at low noise level, such as one for use in a photometric apparatus having the photodiode which is applicable for example to camera.

The construction shown in FIG. 1 as disclosed in Japanese Patent Application Laid-Open 2003-315149 is well known as an integrating circuit for converting photoelectric current detected at photodiode into voltage signals. The photoelectric current integrating circuit shown in FIG. 1 is constructed such that: cathode terminal and anode terminal of photodiode 501 are connected respectively to non-inverting input terminal and inverting input terminal of an operational amplifier 502; a constant voltage supply 503 having voltage value Er is connected to the non-inverting input terminal of the operational amplifier 502; an integrating capacitor 504 for accumulating photoelectric current and a switch 505 for resetting the integrating capacitor 504 are connected between the inverting input terminal and an output terminal of the operational amplifier 502; and an output terminal 506 of the photoelectric current integrating circuit is connected to the output terminal of the operational amplifier 502.

An operation of the photoelectric current integrating circuit having such construction will now be described. Before detecting photoelectric current, the switch 505 is closed so that in this condition the voltage Er of the constant voltage supply 503 is outputted to the output terminal of the operational amplifier 502. The switch 505 is then disconnected to start detection of the photoelectric current by the photodiode 501. Supposing the photoelectric current detected by photodiode 501 after passage of time t subsequent to the disconnection of the switch 505 as Ip, and value of the integrating capacitor 504 as Cint, output voltage Vout occurring at the output terminal 506 is represented as in the following equation (1), and a voltage signal is obtained.

$$V_{out} = E_r - I_p t / C_{int} \quad (1)$$

In the prior-art photoelectric current integrating circuit as disclosed in the above publication, error components not shown in (1) do occur. A factor occurring such error components is a noise caused mainly by an amplifier consisting of a parasitic capacitance Cst consisting of junction capacitance connected in parallel with the photodiode 501, an integrating capacitance Cint, and the operational amplifier 502. It should be noted that the noise occurring from the operational amplifier can usually be represented by an input-referred noise, and may be considered as equivalently occurring at an input terminal section of the operational amplifier 502. A prior-art photoelectric current integrating circuit with considering a parasitic capacitance 507 of photodiode 501 as Cst and input-referred noise 508 of the operational amplifier as En is shown in FIG. 2. At this time, supposing the error (hereinafter referred to as noise voltage) occurring at the output terminal 506 as Enout, the output voltage Vout is represented by the following equation (2).

$$V_{out} = E_r - I_p t / C_{int} + E_{nout} \quad (2)$$

The noise voltage Enout in FIG. 2 will now be noticed to describe its operation. Supposing the change amounts when the analog switch 505 is disconnected of the electric charges accumulated at the parasitic capacitance Cst and at the integrating capacitance Cint due to the input-referred noise 508 respectively as $\Delta Q1$, $\Delta Q2$, and potentials of the inverting input terminal and non-inverting input terminal of the operational amplifier 502 respectively as $Vin^-$ and $Vin^+$, the following equations are obtained.

$$\Delta Q1 = C_{st}(Vin^- + En - Vin^+) \quad (3)$$

$$\Delta Q2 = C_{int}(Vin^- + En - E_{nout}) \quad (4)$$

$$\Delta Q1 + \Delta Q2 = 0 \quad (5)$$

$$E_{nout} = A(\omega)(Vin^+ - Vin^-) \quad (6)$$

where $A(\omega)$ is an open-loop-gain of the operational amplifier 502, and is represented by the following equation (7).

$$A(\omega) = A_o / (1 + j\omega/\omega_c) \quad (7)$$

where $\omega$ is angular frequency, $\omega c$ is cut-off frequency, and Ao is open-loop gain under DC.

Further, since voltage Er of the constant voltage supply 503 is constant, the change amount $\Delta Er$ of Er when the analog switch 505 is disconnected is represented by the following equation (8).

$$\Delta E_r = Vin^+ = 0 \quad (8)$$

From equations (2) to (8), the following equation (9) is obtained.

$$E_{nout} = [(C_{st} + C_{int})En + C_{int}\Delta E_r] / [(C_{st} + C_{int})/A(\omega) + C_{int}] \quad (9)$$

Here, if the operational amplifier is in its ideal condition, i.e. $A(\omega) = \infty$, equation (9) becomes the following equation (10), and the noise En of the operational amplifier is outputted as multiplied by $(1 + C_{st}/C_{int})$.

$$E_{nout} = (1 + C_{st}/C_{int})En \quad (10)$$

SUMMARY OF THE INVENTION

In accordance with a first aspect of the invention, there is provided a photoelectric current integrating circuit including: a first operational amplifier with a switch and an integrating capacitor connected in parallel between an input terminal and an output terminal thereof; a photodiode; and a current passing circuit provided between one terminal of the photodiode and the input terminal of the first operational amplifier, for passing a photoelectric current detected at the photodiode while blocking a connection between a parasitic capacitance of the photodiode and the integrating capacitor.

In a second aspect of the invention, the current passing circuit in the photoelectric current integrating circuit according to the first aspect includes: a second operational amplifier connected at an inverting input terminal thereof to the one terminal of the photodiode and at a non-inverting input terminal thereof to a constant voltage supply; and a transistor connected at a first terminal thereof to the inverting input terminal of the second operational amplifier, at a second terminal thereof to the input terminal of the first operational amplifier, and at a control terminal thereof to an output terminal of the second operational amplifier.

In a third aspect of the invention, the other terminal of the photodiode in the photoelectric current integrating circuit according to the second aspect is connected to the non-inverting input terminal of the second operational amplifier.

In a fourth aspect of the invention, the other terminal of the photodiode in the photoelectric current integrating circuit according to the second aspect, when the constant voltage supply is defined as a first constant voltage supply, is connected to a second constant voltage supply which provides a reverse bias on the photodiode.

In a fifth aspect of the invention, the current passing circuit in the photoelectric current integrating circuit according to the second aspect includes a bias current circuit for supplying a bias current between the first terminal and the second terminal of the transistor.

In a sixth aspect of the inventions the current passing circuit in the photoelectric current integrating circuit according to the first aspect includes: a second operational amplifier connected at an inverting input terminal thereof to the one terminal of the photodiode and at a non-inverting input terminal thereof to a constant voltage supply; a transistor connected at a first terminal thereof to the inverting input terminal of the second operational amplifier, at a second terminal thereof to the input terminal of the first operational amplifier, and at a control terminal thereof to an output terminal of the second operational amplifier; a first constant current supply connected to the first terminal of the transistor; and a second constant current supply connected to the second terminal of the transistor.

DESCRIPTION OF THE PREFERRED EMBODIMENTS

Some embodiments of the photoelectric current integrating circuit according to the invention will be described below with reference to the drawings.

Embodiment 1

Figure 1:
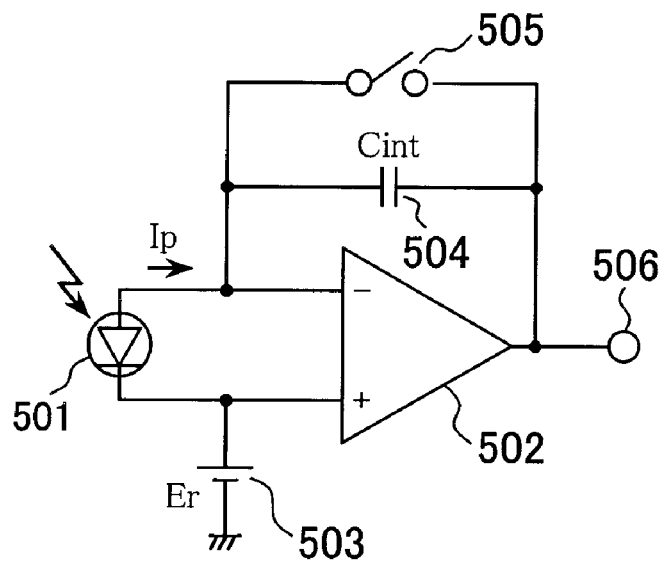
FIG. 1 is a circuit diagram showing construction of a prior-art photoelectric current integrating circuit.
Figure 2:
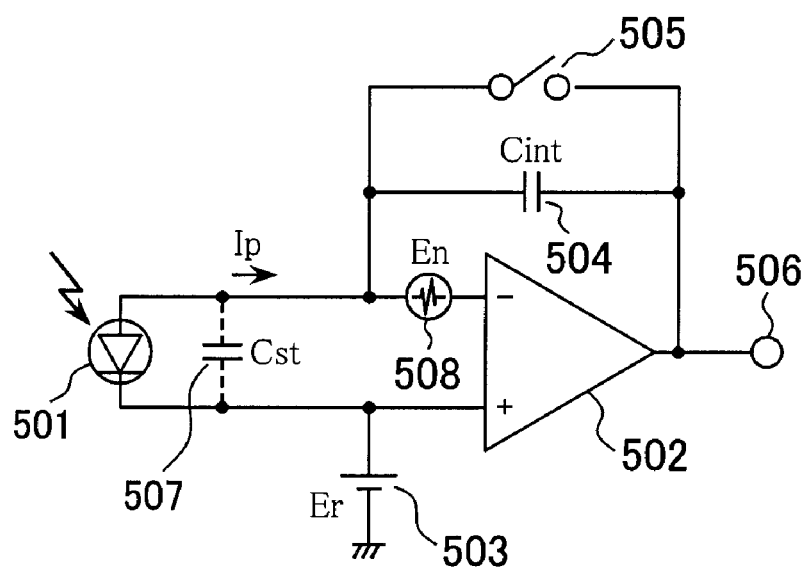
FIG. 2 notices noise voltage to explain its action in the prior-art photoelectric current integrating circuit shown in FIG. 1.
Figure 3:
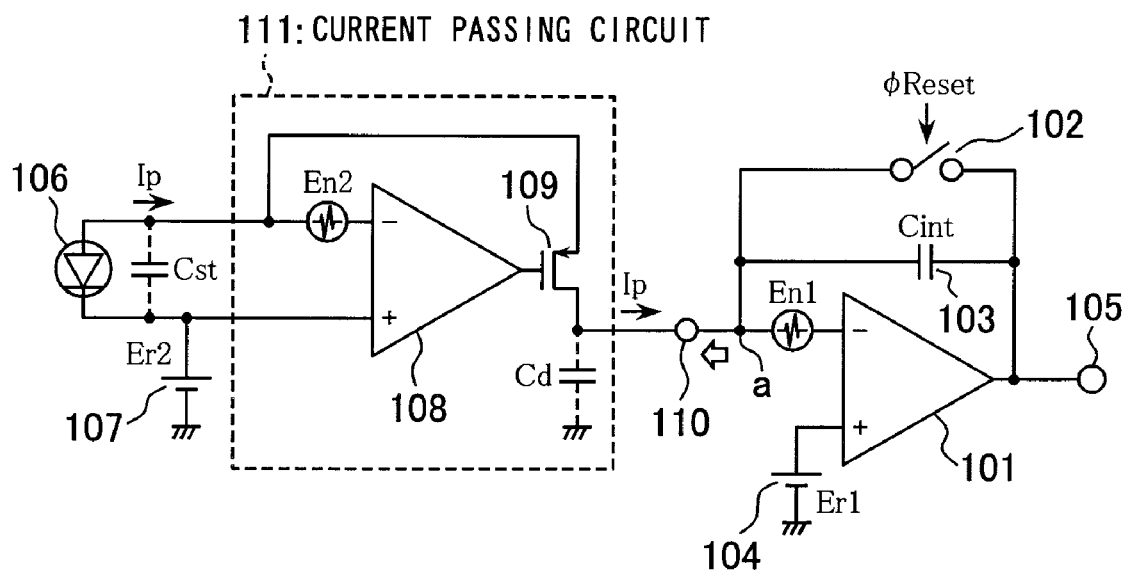
FIG. 3 is a circuit diagram showing construction of a first embodiment of the photoelectric current integrating circuit according to the invention.

A first embodiment of the photoelectric current integrating circuit according to the invention will now be described. FIG. 3 is a circuit diagram showing construction of the first embodiment of the photoelectric current integrating circuit according to the invention. In FIG. 3, what is denoted by numeral 101 is a first operational amplifier. An integrating capacitor 103 and a switch 102 to be controlled by reset signal φ Reset are connected in parallel between an inverting input terminal and an output terminal of the first operational amplifier 101; and a non-inverting input terminal of the first operational amplifier 101 is connected to a first constant voltage supply 104, and its output terminal is connected to an output terminal 105 of the photoelectric current integrating circuit. Further, the inverting input terminal of the first operational amplifier 101 is connected to a terminal 110. What is denoted by numeral 106 is a photodiode for detecting an incident light. A cathode terminal of the photodiode 106 is connected to a non-inverting input terminal of a second operational amplifier 108 to which a second constant voltage supply 107 is connected, and an anode terminal of the photodiode 106 is connected to an inverting input terminal of the second operational amplifier 108.

Further, a source terminal or a first terminal of PMOS transistor 109, which is connected at its gate serving as control terminal to an output terminal of the second operational amplifier 108, is connected to the inverting input terminal of the second operational amplifier 108, and a drain terminal or a second terminal of the PMOS transistor 109 is connected to the terminal 110 to which the inverting input terminal of the first operational amplifier 101 is connected. It should be noted that a current passing circuit 111 is formed by the second operational amplifier 108 and the PMOS transistor 109.

An operation will now be briefly described of the circuit corresponding to a former stage of the photoelectric current integrating circuit according to the first embodiment having such construction. The anode terminal of the photodiode 106 is connected to the inverting input terminal of the second operational amplifier 108 to which negative feedback is applied, and its cathode terminal to the non-inverting input terminal thereof. Accordingly, voltage between anode and cathode of the photodiode 106 becomes zero by a virtual short circuit of the operational amplifier so that a photoelectric current with an occurrence of dark current caused in applying a bias voltage being suppressed is detected from the photodiode 106.

A photoelectric current Ip detected by the photodiode 106 flows as a drain current of the PMOS transistor 109 which is controlled by the second operational amplifier 108 of the current passing circuit 111, and is transmitted to the circuit corresponding to a latter stage through the terminal 110.

An operation of the photoelectric current integrating circuit as a whole according to the first embodiment will now be described. At first, the state before detecting photoelectric current will be described. While an input-referred noise En2 equivalently occurs at the input terminal section of the second operational amplifier 108 so as to affect a source potential of PMOS transistor 109, the drain current i.e. photoelectric current Ip is not affected. The switch 102 before detecting photoelectric current is in its closed state, and, at this time, the output terminal of the first operational amplifier 101, i.e. the output terminal 105 of the photoelectric current integrating circuit is brought to the same potential as the non-inverting input terminal of the first operational amplifier 101. Accordingly, supposing the input-referred noise of the first operational amplifier 101 as En1, the voltage Er1 of the first constant voltage supply 104 and the input-referred noise En1 are outputted as shown in the following equation (11) as output voltage Vout.

$$Vout = Er1 + En1 \quad (11)$$

An operation at the time of detecting photoelectric current will now be described. As the switch 102 is disconnected by instruction (not shown), the integrating capacitor 103 is electrically connected between the inverting input terminal and the output terminal of the first operational amplifier 101 to start detection of photoelectric current. The photoelectric current Ip outputted from the current passing circuit 111 of the former stage flows into and is accumulated as electric charge at the integrating capacitor 103 which is electrically connected between the inverting input terminal and the output terminal of the first operational amplifier 101, and a voltage proportional to the amount of electric charge is outputted from the output terminal 105. In particular, supposing Cint as the value of the integrating capacitor 103 at passage of time t after the disconnection of switch 102 and Enout as the noise voltage outputted from the output terminal 105, the output voltage Vout occurring at the output terminal 105 of the photoelectric current integrating circuit becomes as shown in the following equation (12), and a voltage signal is obtained.

$$Vout = Er1 - Ipt/Cint + Enout \quad (12)$$

Here, while, as previously described, the input-referred noise En2 equivalently occurs at the input terminal section of the second operational amplifier 108 so as to affect the source potential of PMOS transistor 109, the drain current i.e. photoelectric current Ip is not affected. Further, a drain capacitance Cd of PMOS transistor 109 is connected to the connecting point (point "a" in the figure) among the inverting input terminal of the first operational amplifier 101, the switch 102 and the integrating capacitor 103. Since the input-referred noise of the first operational amplifier 101 is En1, the noise voltage Enout outputted from the output terminal 105 of the photoelectric current integrating circuit according to the present embodiment is obtained as in the following equation (13).

$$Enout = (1 + Cd/Cint)En1 \quad (13)$$

Here, the drain capacitance Cd of MOS transistor is usually several-ten fF or lower. Since, therefore, Cd<<Cint, the equation (13) is rearranged into the following equation (14).

$$Enout \approx En1 \quad (14)$$

Accordingly, the output voltage Vout of the photoelectric current integrating circuit is obtained as in the following equation (15), and the output noise overlapped on the output signal of the photoelectric current integrating circuit becomes the input-referred noise of the first operational amplifier 101.

$$Vout = Er1 - Ipt/Cint + En1 \quad (15)$$

In thus constructed photoelectric current integrating circuit, the noise of the operational amplifier is not amplified even when the parasitic capacitance of the photodiode is large so that a photoelectric current integrating circuit with low noise can be achieved. Further, since an unwanted dark current occurring at the photodiode is suppressed, the photoelectric current integrating circuit can be achieved as capable of detecting signal at high accuracy.

It should be noted that, in the above described embodiments, the anode terminal of photodiode 106 is connected to the inverting input terminal of the second operational amplifier 108, and the cathode terminal to the non-inverting input terminal of the second operational amplifier 108. It is however also possible to obtain similar advantage by using NMOS transistor as the transistor 109 and connecting the cathode terminal of photodiode 106 to the inverting input terminal of the second operational amplifier 108, and the anode terminal to the non-inverting input terminal of the second operational amplifier 108.

Figure 4:
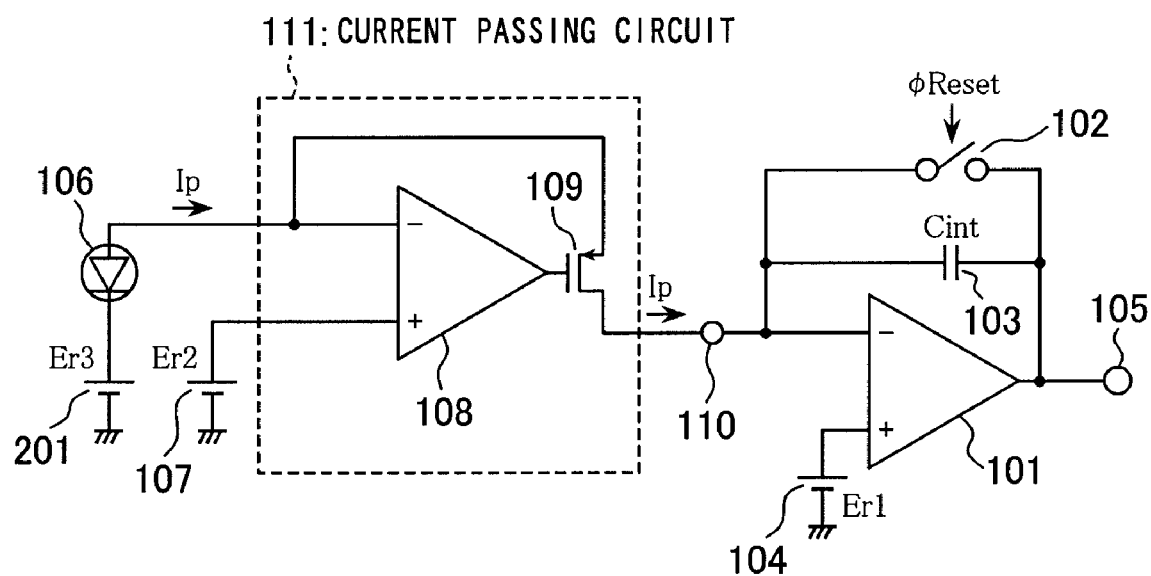
FIG. 4 is a circuit diagram showing a modification of the first embodiment shown in FIG. 3.

Also, as shown in FIG. 4, it is possible to connect the cathode terminal of photodiode 106 to a third constant voltage supply (voltage Er3) 201 with which a reverse bias on photodiode 106 is obtained, i.e. "cathode potential>anode potential". In thus constructed photoelectric current integrating circuit, PN junction capacitance that constitutes nearly all of the parasitic capacitance Cst of photodiode 106 can be reduced by the reverse biasing of photodiode 106. The input capacitance to the current passing circuit 111 can be thereby reduced to achieve a high-speed and low-noise photoelectric current integrating circuit.

Embodiment 2

Figure 5:
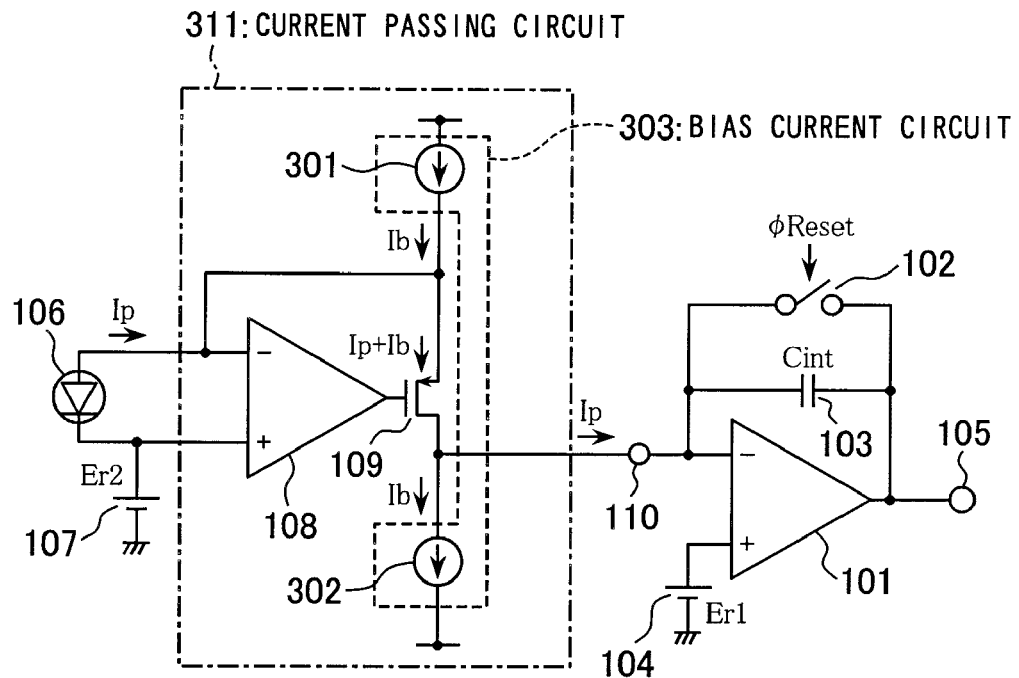
FIG. 5 is a circuit diagram showing construction of the photoelectric current integrating circuit according to a second embodiment of the invention.

A second embodiment of the photoelectric current integrating circuit according to the invention will now be described. FIG. 5 is a circuit diagram showing construction according to the second embodiment. Those components common with the first embodiment shown in FIG. 3 are denoted by like reference numerals and description thereof will be partially omitted. In FIG. 5, what is denoted by numeral 311 is a current passing circuit. The current passing circuit 311 includes: a second operational amplifier 108 connected at an inverting input terminal thereof to the anode terminal of photodiode 106, and at a non-inverting input terminal thereof respectively to the cathode terminal of the photodiode 106 and to a second constant voltage supply 107; PMOS transistor 109 connected at a source terminal or its first terminal to the inverting input terminal of the second operational amplifier 108, at a drain terminal or its second terminal to a terminal 110, and at a gate terminal or its control terminal to an output terminal of the second operational amplifier 108; a first constant current supply 301 connected to the source terminal of PMOS transistor 109; and a second constant current supply 302 connected to the drain terminal of the PMOS transistor 109.

It should be noted that the current values of the first constant current supply 301 and the second constant current supply 302 are both Ib. Further, concerning such currents, the current of the first constant current supply 301 flows toward the direction of flowing into the source terminal of the PMOS transistor 109, and the current of the second constant current supply 302 flows toward the direction of flowing out from the drain terminal of the PMOS transistor 109. The circuit consisting of the first constant current supply 301 and the second constant current supply 302 constitute a bias current circuit 303 with which an electric current of a certain level or above is continuously supplied to the PMOS transistor 109.

An operation of thus constructed second embodiment will now be described. The photoelectric current Ip detected at the photodiode 106 is added to an electric current Ib outputted from the first constant current supply 301 and is transmitted to the PMOS transistor 109. Supposing the drain current and source currents of PMOS transistor 109 as Id, Is, these are represented as in the following equation (16) so that a current equal to or greater than the constant current Ib continuously flows to the PMOS transistor 109.

$$Id = Is = Ip + Ib \quad (16)$$

The drain current Id of PMOS transistor 109 is then transmitted to the terminal 110 with the constant current Ib being subtracted therefrom by the second constant current supply 302. In other words, output current Io of the current passing circuit 311 is represented as in the following equation (17), and only the photoelectric current. Ip is outputted.

$$Io = Is - Ib = Ip \quad (17)$$

In thus constructed photoelectric current integrating circuit, a bias current is caused to flow through the MOS transistor of the current passing circuit 311. Accordingly, the operation of MOS transistor does not become unstable even when the photoelectric current has fallen to a minimum value, whereby stable circuit operation of the current passing circuit 311 is continuously maintained. It is thereby possible to achieve a stable and low-noise photoelectric current integrating circuit.

Figure 6:
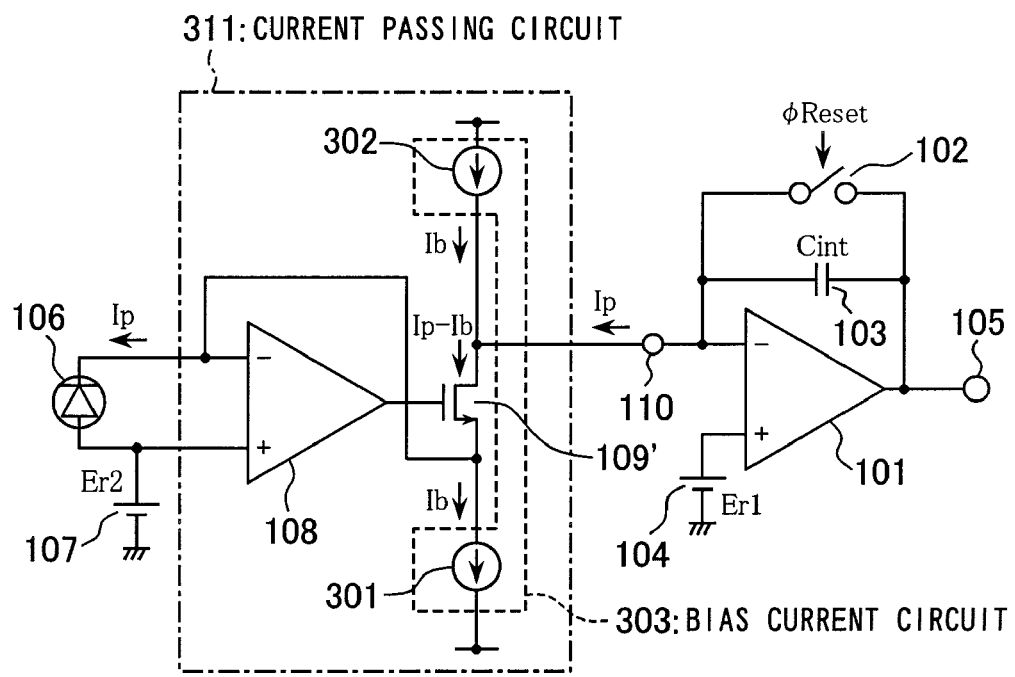
FIG. 6 is a circuit diagram showing a modification of the second embodiment shown in FIG. 5.

While, in the present embodiment, the anode terminal of photodiode 106 is connected to the inverting input terminal of the second operational amplifier 108, and the cathode terminal to the non-inverting input terminal of the second operational amplifier 108, it is also possible as shown in FIG. 6 to obtain a similar advantage by connecting the cathode terminal of photodiode 106 to the inverting input terminal of the second operational amplifier 108, and the anode terminal to the non-inverting input terminal of the second operational amplifier 108. At this time, NMOS transistor 109' is used as the transistor of the current passing circuit 311. Further, concerning the first and second constant current supply 301, 302, the current of the first constant current supply 301 flows toward the direction of flowing out from the source terminal of the NMOS transistor 109', and the current of the second constant current supply 302 flows toward the direction of flowing into the drain terminal of the NMOS transistor 109'.

Figure 7:
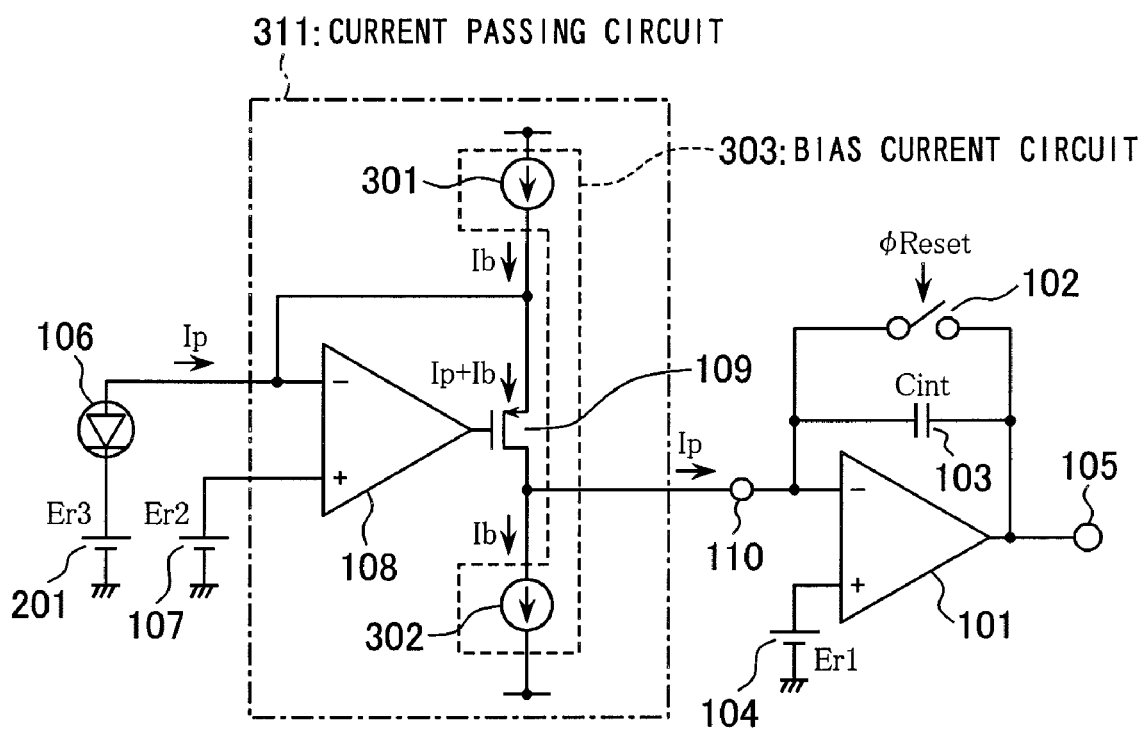
FIG. 7 is a circuit diagram showing another modification of the second embodiment shown in FIG. 5.

Further, as shown in FIG. 7, similarly to FIG. 4 where a modification of the first embodiment has been shown, it is also possible to connect the cathode terminal of photodiode 106 to a constant voltage supply 201 with which a reverse bias on photodiode 106 is obtained, i.e. "cathode potential>anode potential".

In thus constructed photoelectric current integrating circuit, PN junction capacitance that constitutes nearly all of the parasitic capacitance of the photodiode can be reduced by the reverse biasing of the photodiode. The input capacitance of the current passing circuit 311 can be thereby reduced to provide a high-speed and low-noise photoelectric current integrating circuit.

Further, while, in the above embodiments, MOS transistor has been used as the transistor for constituting the current passing circuit, it is also possible to use a bipolar transistor.

As has been described by way of the above embodiments, with the photoelectric current integrating circuit according to the first and second aspects of the invention, photoelectric current detected at the photodiode is passed through while connection between a parasitic capacitance of photodiode and the integrating capacitor is blocked so that the noise of the first operational amplifier is not amplified even when the parasitic capacitance of the photodiode is large, making it possible to achieve a low-noise photoelectric current integrating circuit. With the photoelectric current integrating circuit according to the third aspect, since unwanted dark current occurring at photodiode can be suppressed, it is possible to achieve a photoelectric current integrating circuit capable of signal detection with low noise and at high accuracy. With the photoelectric current integrating circuit according to the fourth aspect, PN junction capacitance that constitutes nearly all of the parasitic capacitance of photodiode can be reduced by application of reverse bias on the photodiode, whereby the input capacitance of the current passing circuit can be reduced to achieve a high-speed and low-noise photoelectric current integrating circuit. With the photoelectric current integrating circuit according to the fifth and sixth aspects, since a bias current flows to the transistor of the current passing circuit, the operation of the transistor does not become unstable even when the photoelectric current has fallen to a minimum value so that the current passing circuit continuously maintains stable circuit operation. It is thereby possible to achieve a stable and low-noise photoelectric current integrating circuit.

What is claimed is:

1. A photoelectric current integrating circuit comprising:
   a first operational amplifier with a switch and an integrating capacitor connected in parallel between an input terminal and an output terminal thereof;
   a photodiode that detects a photoelectric current; and
   a current passing circuit provided between one terminal of said photodiode and the input terminal of said first operational amplifier, for passing the photoelectric current detected at said photodiode while blocking a connection between a parasitic capacitance of said photodiode and said integrating capacitor,
   wherein said current passing circuit comprises:
      a second operational amplifier having an inverting input terminal connected to said one terminal of said photodiode and a non-inverting input terminal connected to a constant voltage supply;
      a transistor having a first terminal connected to the inverting input terminal of said second operational amplifier, a second terminal connected to the input terminal of said first operational amplifier, and a control terminal connected to an output terminal of said second operational amplifier; and
      a bias current circuit for supplying a bias current between the first terminal and the second terminal of said transistor.

2. The photoelectric current integrating circuit according to claim 1, wherein the other terminal of said photodiode is connected to the non-inverting input terminal of said second operational amplifier.

3. The photoelectric current integrating circuit according to claim 1, wherein, when said constant voltage supply is defined as a first constant voltage supply, the other terminal of said photodiode is connected to a second constant voltage supply which provides a reverse bias on the photodiode.

4. A photoelectric current integrating circuit comprising:
   a first operational amplifier with a switch and an integrating capacitor connected in parallel between an input terminal and an output terminal thereof;
   a photodiode that detects a photoelectric current; and
   a current passing circuit provided between one terminal of said photodiode and the input terminal of said first operational amplifier, for passing the photoelectric current detected at said photodiode while blocking a connection between a parasitic capacitance of said photodiode and said integrating capacitor,
   wherein said current passing circuit comprises:
      a second operational amplifier having an inverting input terminal connected to said one terminal of said photodiode and a non-inverting input terminal connected to a constant voltage supply;
      a transistor having a first terminal connected to the inverting input terminal of said second operational amplifier, a second terminal connected to the input terminal of said first operational amplifier, and a control terminal connected to an output terminal of said second operational amplifier;
      a first constant current supply connected to said first terminal of said transistor; and
      a second constant current supply connected to said second terminal of said transistor.

* * * * *